United States Patent
Matsushita et al.

(10) Patent No.: US 9,981,684 B2
(45) Date of Patent: May 29, 2018

(54) VEHICLE POWER STEERING CONTROL APPARATUS

(75) Inventors: Masaki Matsushita, Chiyoda-ku (JP); Takayuki Kifuku, Chiyoda-ku (JP); Hiroyuki Kozuki, Chiyoda-ku (JP); Masatoshi Saito, Chiyoda-ku (JP); Yu Kawano, Chiyoda-ku (JP)

(73) Assignee: Mitsubishi Electric Corporation, Chiyoda-ku, Tokyo (JP)

( * ) Notice: Subject to any disclaimer, the term of this patent is extended or adjusted under 35 U.S.C. 154(b) by 0 days. days.

(21) Appl. No.: 14/344,101

(22) PCT Filed: Dec. 5, 2011

(86) PCT No.: PCT/JP2011/078057
§ 371 (c)(1),
(2), (4) Date: Mar. 11, 2014

(87) PCT Pub. No.: WO2013/084277
PCT Pub. Date: Jun. 13, 2013

(65) Prior Publication Data
US 2014/0350791 A1  Nov. 27, 2014

(51) Int. Cl.
*B62D 6/00* (2006.01)
*B62D 5/04* (2006.01)
(Continued)

(52) U.S. Cl.
CPC ............ *B62D 6/00* (2013.01); *B62D 5/0481* (2013.01); *B62D 5/0484* (2013.01); *H02H 7/09* (2013.01);
(Continued)

(58) Field of Classification Search
CPC ......... B60W 10/20; B60W 30/12; B62D 6/00; B62D 5/0481; B62D 5/0484; B62D 5/04;
(Continued)

(56) References Cited

U.S. PATENT DOCUMENTS 5,315,533 A * 5/1994 Stich et al. .................. 700/298
5,360,077 A   11/1994 Nishimoto et al.
(Continued)

FOREIGN PATENT DOCUMENTS

EP   0572961 A2   12/1993
JP   10-51954 A    2/1998
(Continued)

OTHER PUBLICATIONS

International Search Report of PCT/JP2011/078057, dated Feb. 28, 2012.
(Continued)

*Primary Examiner* — Behrang Badii
(74) *Attorney, Agent, or Firm* — Sughrue Mion, PLLC; Richard C. Turner

(57) ABSTRACT

A vehicle steering control apparatus includes a power-supply supply portion 101 supplying a power supply to a micro-controller 102, an inverter 104 supplying power to drive a motor 5, a gate driver 103 controlling the inverter 104, a motor relay 105 opening and closing a current-passing path between the inverter 104 and the motor 5, a motor relay driver 106 controlling the motor relay 105, and a monitoring control portion A 108a and a monitoring control portion B 108b monitoring a power-supply voltage of the power-supply supply portion 101. Because multiple monitoring control portions are included, even in the event of an inconvenience in either one of the monitoring control portions A 108a and B 108b, the motor 5 can be stopped quickly in a reliable manner when the power-supply voltage goes out of a normal operation range.

9 Claims, 7 Drawing Sheets

(51) Int. Cl.
*H02H 7/09* (2006.01)
*H02H 9/04* (2006.01)
*H02P 29/024* (2016.01)
*B60W 30/12* (2006.01)
*G01R 31/327* (2006.01)
*B62D 6/10* (2006.01)
*G06F 7/00* (2006.01)
*B62D 15/02* (2006.01)
*G06F 17/00* (2006.01)
*H02H 9/00* (2006.01)

(52) U.S. Cl.
CPC ........... *H02H 9/04* (2013.01); *H02P 29/0241* (2016.02); *B60W 30/12* (2013.01); *B62D 5/04* (2013.01); *B62D 5/0472* (2013.01); *B62D 5/0487* (2013.01); *B62D 6/10* (2013.01); *B62D 15/025* (2013.01); *G01R 31/3277* (2013.01); *G06F 7/00* (2013.01); *G06F 17/00* (2013.01); *H02H 9/00* (2013.01)

(58) Field of Classification Search
CPC .. B62D 5/0487; B62D 5/0472; B62D 15/025; B62D 5/046; B62D 6/10; H02P 29/0241; H02P 29/032; H02H 7/09; H02H 9/04; H02H 9/00; G06F 7/00; G06F 17/00; B60L 1/003; B60L 11/1803; B60L 11/1816; B60L 11/1874; B60L 11/1875; G01R 31/3277; H01M 10/44; H01M 10/48; H01M 10/625; H01M 10/615; H01M 10/613
USPC .......................................................... 701/41
See application file for complete search history.

(56) References Cited

U.S. PATENT DOCUMENTS

| | | | | |
|---|---|---|---|---|
| 5,465,011 A | * | 11/1995 | Miller et al. | 307/64 |
| 5,737,168 A | * | 4/1998 | Baker | 361/90 |
| 2005/0036248 A1 | * | 2/2005 | Klikic et al. | 361/42 |
| 2005/0077878 A1 | * | 4/2005 | Carrier et al. | 320/134 |
| 2005/0210326 A1 | | 9/2005 | Nishimura et al. | |
| 2007/0205041 A1 | * | 9/2007 | Nishizaki | B62D 5/0472 180/446 |
| 2009/0281705 A1 | * | 11/2009 | Kernwein | B60T 17/221 701/97 |
| 2010/0125385 A1 | | 5/2010 | Ogawa et al. | |
| 2011/0133715 A1 | | 6/2011 | Zushi et al. | |
| 2011/0137488 A1 | * | 6/2011 | Sakugawa | B60W 30/12 701/1 |
| 2011/0205672 A1 | * | 8/2011 | Sakai | B62D 5/0487 361/18 |
| 2011/0286843 A1 | * | 11/2011 | Lengl | F03D 7/0224 416/31 |
| 2012/0261207 A1 | * | 10/2012 | Kawanaka | B62D 5/0484 180/404 |

FOREIGN PATENT DOCUMENTS

| | | |
|---|---|---|
| JP | 11-072528 A | 3/1999 |
| JP | 2000-23483 A | 1/2000 |
| JP | 2005-208939 A | 8/2005 |
| JP | 2005250854 A | 9/2005 |
| JP | 2011120422 A | 6/2011 |
| KR | 20030087256 A | 11/2003 |
| WO | 2008/146372 A1 | 12/2008 |

OTHER PUBLICATIONS

Communication dated Nov. 11, 2014, issued by the Japanese Patent Office in counterpart Application No. 2013547971.
Communication dated Jun. 19, 2015 from the European Patent Office in counterpart application No. 11877153.4.
Communication dated Oct. 14, 2016, from the Korean Intellectual Patent Office, in counterpart Korean application No. 10-2016-7023527.
Communication dated Oct. 14, 2016, from the Korean Intellectual Patent Office, in counterpart Korean application No. 10-2016-7023530.
Communication dated Sep. 24, 2015 from the Korean Intellectual Patent Office issued in corresponding Korean application No. 10-2014-7009781.

\* cited by examiner

VEHICLE POWER STEERING CONTROL APPARATUS

CROSS REFERENCE TO RELATED APPLICATIONS

This application is a National Stage of International Application No. PCT/JP2011/078057 filed Dec. 5, 2011, the contents of all of which are incorporated herein by reference in their entirety.

TECHNICAL FIELD

The present invention relates to an electronic control unit furnished with a power-supply voltage monitoring function and a vehicle steering control apparatus equipped with the same.

BACKGROUND ART

A steering of an automobile or the like in the related art is controlled at an optimal torque by an electronic control unit (micro-controller or micro-computer, hereinafter, referred to as the micro-controller) in consideration of a vehicle speed or the like. However, when a power-supply voltage of the micro-computer performing control goes out of a normal operation voltage range of the micro-controller and an abnormality occurs in an operation of the micro-controller, inconveniences, such as rotation and locking of the steering, may possibly occur. It is therefore necessary to maintain the power-supply voltage within an appropriate range and also to constantly monitor the power-supply voltage to be supplied to the micro-controller.

As a measure to prevent the occurrence of such an abnormality resulting from a fluctuation of a power-supply voltage of the micro-controller by monitoring the power-supply voltage, for example, a micro-computer power-supply voltage monitoring system is described in PTL 1. The micro-computer power-supply voltage monitoring system 1 is formed of a micro-computer 10 that controls an outside load 60 and a power-supply supply portion 20 that supplies the micro-computer 10 with a power-supply voltage. An operation monitoring circuit 30 (formed of a watchdog circuit and homework solutions) monitoring whether an operation of the micro-computer 10 is normal or not is connected to the micro-computer 10. A power-supply voltage supplied from the power-supply supply portion 20 is applied to a power-supply terminal of the micro-computer 10 and at the same time introduced into the micro-computer 10 from an input and output port thereof. The power-supply voltage inputted from the port is compared with an appropriate power-supply voltage value 11 indicating "a power-supply voltage range within which an operation is guaranteed" for the micro-computer 10, so that whether the power-supply voltage is an appropriate power-supply voltage or not is monitored. On the other hand, the micro-computer 10 controls an output driver 40 connected to the outside load 60 by outputting a control signal Sc. An output of this power-supply monitoring means 12 and an output of the operation monitoring circuit 30 are introduced into a logical operation circuit 50, such as an OR circuit. When it turns out that the power-supply voltage supplied to the micro-computer 10 is not the appropriate power-supply voltage or an operation of the micro-computer 10 is not normal, the control on the outside load 60 is stopped by inhibiting the output driver 40 that controls the outside load 60 or by resetting the micro-computer. The problem is solved in this manner.

Also, a scanner motor control apparatus described in PTL 2 is formed of a control circuit including a CPU that controls the driving and stopping of a motor 12 driving a document scanning scanner and is reset by a reset signal, and a monitoring circuit 10 that monitors a power-supply voltage Vcc and generates the reset signal when the power-supply voltage Vcc drops to or below a set value. The scanner motor control apparatus includes monitoring circuits 11 and 10 that generate, respectively, a first signal S1=L when the voltage Vcc drops to or below a first set value VREF1 and a second signal S2=L when the voltage Vcc drops to or below a second set value VREF2 smaller than the first set value VREF1. The CPU performs the stopping control in response to the first signal S1=L during the driving of the motor and is reset by the second signal S2=L. The first signal S1=L is applied to an interruption port INT B and the CPU 14 performs the stopping control by interruption processing. The first signal S1=L is applied to an interruption port assigned with the top priority. By applying the first signal S1=L to the interruption input port assigned with the top priority, the CPU performs the stopping control of an electric motor first of all when the power-supply voltage drops. This configuration lessens a burden of the monitoring of a signal level variance. Moreover, because a delay in recognition of a signal level variance is short, the stopping control in response to a signal level variance (from H to L) of the first signal S1 can be achieved more effectively.

CITATION LIST

Patent Literature

PTL 1: JP-A-2005-208939
PTL 2: JP-A-2000-23483

SUMMARY OF INVENTION

Technical Problem

As has been described above, high reliability and safety are required for the power-supply voltage monitoring of the micro-computer that performs the control so as to prevent the electronic unit from having inconveniences. However, the micro-computer power-supply voltage monitoring system of the PTL 1 is configured in such a manner that a power-supply voltage of the micro-computer 10 is monitored by the power-supply monitoring means 12 inside the micro-computer 10 and an operation of the micro-computer 10 is monitored by the operation monitoring circuit 30. Hence, there is a problem that, for example, in the case where the operation monitoring circuit 30 fails first and then a power-supply voltage of the micro-computer 10 becomes a voltage on the outside of the appropriate power-supply voltage range of the micro-computer 10, the power-supply monitoring means 12 inside the micro-computer 10 no longer functions normally and the control of the outside load 60 cannot be stopped.

Also, the scanner motor control apparatus described in PTL 2 includes two voltage monitors monitoring a low voltage of the CPU power-supply voltage. This apparatus is, however, configured in such a manner that the motor driving is stopped via the CPU 14 upon detection of a voltage abnormality. Hence, for example, in the case where a CPU power-supply voltage drops to a low voltage on the outside of the CPU operation guaranteeing voltage range while the voltage monitor 10 is broken, a voltage reduction is detected by the voltage monitor 11 and S1=L is outputted. However, because the voltage is a low voltage on the outside of the CPU operation guaranteeing range, there is a problem that the CPU cannot stop the motor driving.

The invention was devised to solve the problems above and has an object to provide an electronic control unit furnished with a power-supply voltage monitoring function and capable of preventing a false operation of an outside load, which is a subject to be controlled by the electronic control unit (micro-controller), by conferring high reliability to the power-supply voltage monitoring function and a vehicle steering control apparatus equipped with the same.

Solution to Problem

In order to solve the problems above, an electronic control unit furnished with a power-supply voltage monitoring function of the invention is characterized by including: an electronic control portion that controls an outside load; a power-supply supply portion that adjusts a voltage of an outside power supply to be supplied to a power-supply supply terminal of the electronic control portion to be a voltage within a normal operation range of the electronic control portion and supplies the adjusted voltage; and multiple monitoring control portions, each of which is furnished with a voltage monitoring function of monitoring a voltage of the power-supply supply portion and an outside load controlling function of controlling the outside load according to a result of the voltage monitoring, and is characterized in that: in the case where the voltage monitoring function furnished to any one of the multiple monitoring control portions detects that the voltage is on the outside of the normal operation range of the electronic control portion, an outside load driver controlling the outside load is stopped by the outside load controlling function and also at least one of the outside load controlling functions stops the outside load driver controlling the outside load by bypassing the electronic control portion.

Also, a vehicle steering control apparatus set forth in claim 10 is characterized by including the electronic control unit furnished with a power-supply voltage monitoring function set forth in any one of claim 1 to claim 9, and is characterized in that: a subject to be controlled by the electronic control portion is a motor and an inverter that supplies power to drive the motor; the outside load driver is a power-supply relay driver controlling a power-supply relay that opens and closes a power supplying path to the inverter, a gate driver controlling the inverter, and a motor relay driver controlling a motor relay that opens and closes a current-passing path between the inverter and the motor.

Advantageous Effects of Invention

According to the invention, multiple monitoring control portions monitoring a power-supply voltage of the electronic control portion (micro-controller) are provided, and at least one of the outside load controlling functions stops the outside load driver controlling the outside load by bypassing the electronic control portion. Hence, even in the case where a power-supply voltage to be supplied to the electronic control portion goes out of the normal operation range, the outside load can be stopped quickly in a reliable manner. It thus becomes possible to realize an electronic control unit furnished with a power-supply voltage monitoring function and capable of ensuring high reliability and safety. Also, it becomes possible to realize a vehicle steering control apparatus having high reliability and safety by including this electronic control unit furnished with a power-supply voltage monitoring function.

DESCRIPTION OF EMBODIMENTS

Hereinafter, an electronic control unit furnished with a power-supply voltage monitoring function and a vehicle steering control apparatus according to embodiments of the invention will be described with reference to the drawings.

First Embodiment

Figure 1:
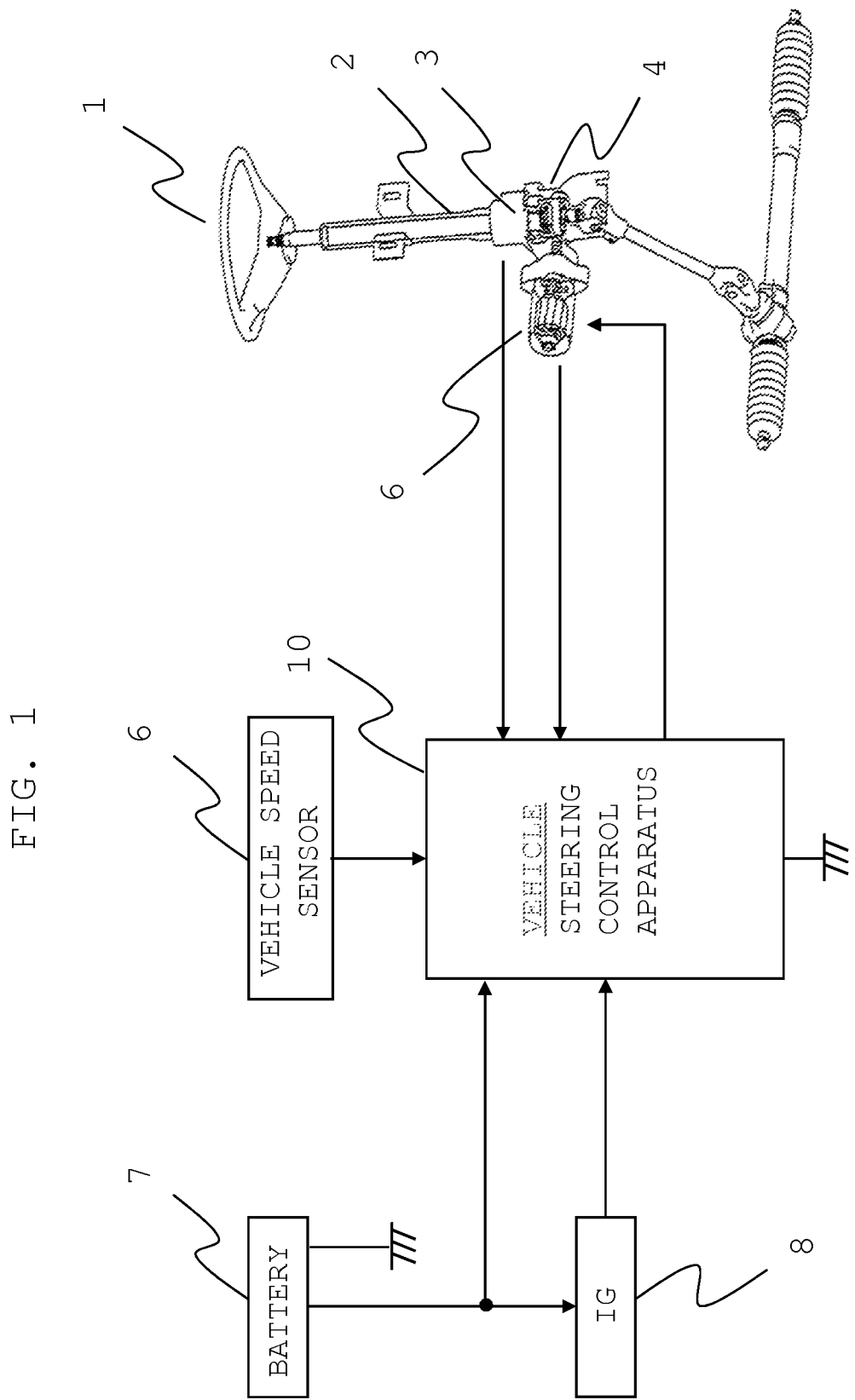
FIG. 1 is a view schematically showing an overall configuration of a vehicle steering control system including an electronic control unit furnished with a power-supply voltage monitoring function of a first embodiment.
Figure 2:
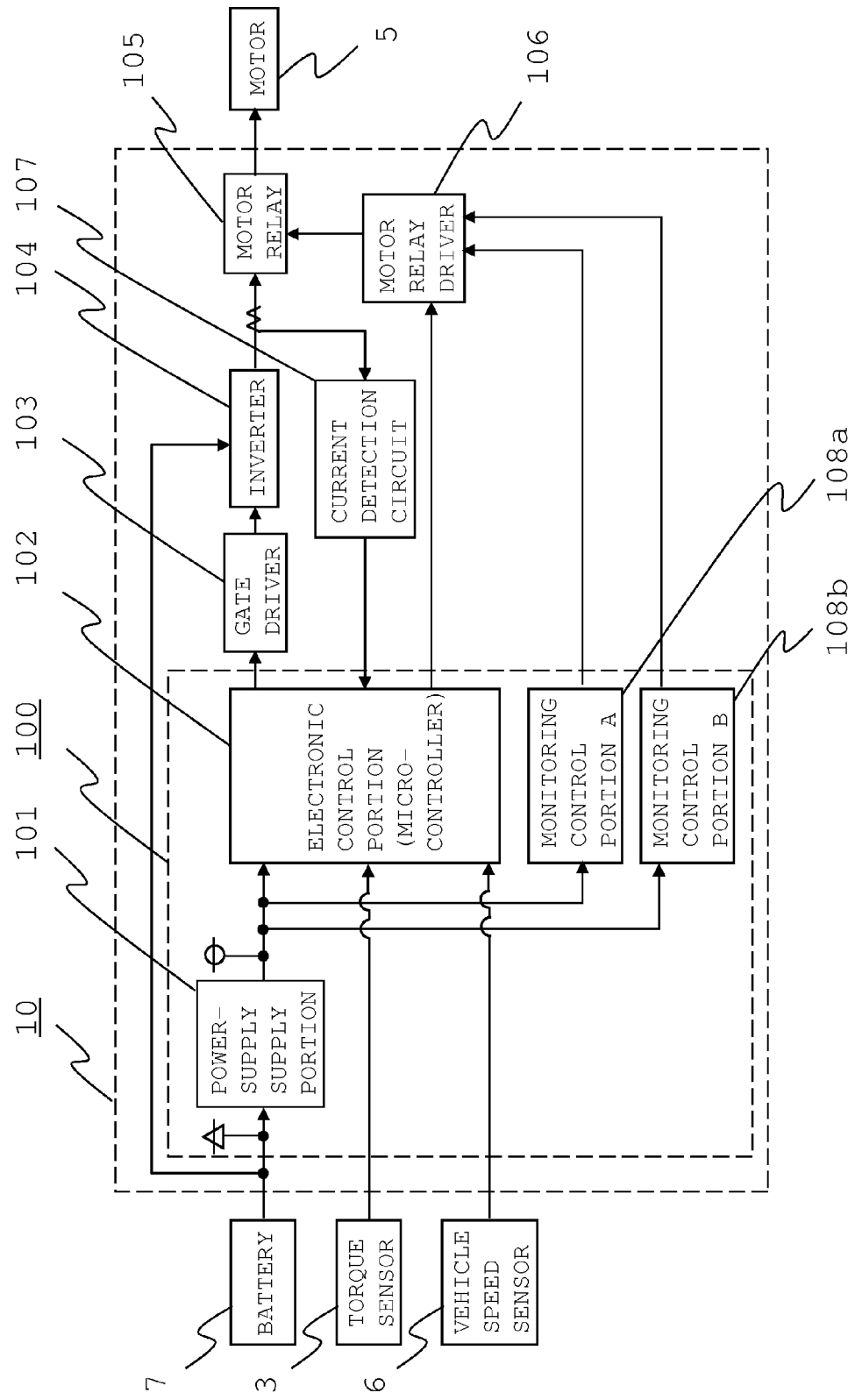
FIG. 2 is a functional block diagram showing a configuration of a vehicle steering control apparatus including the electronic control unit furnished with a power-supply voltage monitoring function of the first embodiment.

FIG. 1 is a view schematically showing an overall configuration of a vehicle steering control system including an electronic control unit furnished with a power-supply voltage monitoring function of a first embodiment. FIG. 2 is a functional block diagram showing a configuration of a vehicle steering control apparatus including the electronic control unit furnished with a power-supply voltage monitoring function of the first embodiment.

As is shown in FIG. 1, a vehicle steering control system to which is applied an electronic control unit 100 furnished with a power-supply voltage monitoring function of the invention is formed of a steering wheel 1 for use in steering wheels, a steering shaft 2 transmitting a rotation state of the steering wheel 1, a torque sensor 3 attached to the steering shaft 2 and detecting a steering torque applied to the steering wheel 1, a reduction gear 4 connected to one end of the steering shaft 2, a motor 5 connected to the reduction gear 4 and generating a steering assist torque, a vehicle steering control apparatus 10 driving the motor 5, a vehicle speed sensor 6 detecting a vehicle speed and transmitting the vehicle speed to the vehicle steering control apparatus 10, a battery 7 supplying the vehicle steering control apparatus 10 with power, and an ignition (IG) 8 supplied with power from the battery 7 and igniting an internal combustion engine.

The vehicle steering control apparatus 10 assists the steering of the steering wheel 1 by determining a steering assist torque on the basis of a torque detection value detected by the torque sensor 3 and a vehicle speed detection value of the vehicle speed sensor 6 and by driving the motor 5.

Next, as is shown in FIG. 2, the vehicle steering control apparatus 10 is formed of the electronic control unit 100 furnished with a power-supply voltage monitoring function of the first embodiment, a micro-controller 102, which is an electronic control portion controlling the motor 5 as an outside load, a power-supply supply portion 101 adjusting power from the battery 7, which is outside power, to an appropriate voltage and supplying the adjusted voltage to a power-supply supply terminal of the micro-controller 102, an inverter 104 supplying power to drive the motor 5, a gate driver 103 controlling the inverter 104 according to a command from the micro-controller 102, a motor relay 105 opening and closing a current-passing path between the inverter 104 and the motor 5, a motor relay driver 106 controlling the motor relay 105, and a monitoring control portion A 108a and a monitoring control portion B 108b monitoring a power-supply voltage of the power-supply supply portion 101. Of these components, the electronic control unit 100 furnished with a power-supply voltage monitoring function of the first embodiment is a portion formed of the power-supply supply portion 101, the micro-controller 102, the monitoring control portion A 108a, and the monitoring control portion B 108b.

Operations of the vehicle steering control apparatus 10 and the electronic control unit 100 furnished with a power-supply voltage monitoring function will now be described with reference to FIG. 1 and FIG. 2.

Initially, the power-supply supply portion 101 adjusts power of the battery 7 to be an appropriate voltage within a normal operation range of the micro-controller, and supplies a constant voltage (for example, 5 V) necessary to operate the micro-controller 102 to the power-supply supply terminal of the micro-controller 102.

The micro-controller 102 performs predetermined arithmetic processing on the basis of a torque detection value detected by the torque sensor 3 and a vehicle speed detection value of the vehicle speed sensor 6 and determines a target current value (Ti1) to drive the motor 5. The micro-controller 102 then performs feedback control so that a detection current value (Mi) detected by a current detection circuit 107 coincides with the target current value (Ti1) and supplies a motor drive signal to the gate driver 103. Also, the micro-controller 102 outputs a motor relay close command signal (energization) or a motor relay open command signal (de-energization) to the motor relay driver 106.

The gate driver 103 outputs a signal to drive the inverter 104 to the inverter 104 according to the motor drive signal inputted therein from the micro-controller 102. The inverter 104 outputs a voltage to drive the motor 5 via the motor relay 105 according to the signal inputted therein from the gate driver 103.

Upon input of the motor relay close command signal (energization) from the motor relay driver 106, the motor relay 105 energizes the current-passing path between the inverter 104 and the motor 5. Meanwhile, upon input of the motor relay open command signal (de-energization) from the motor relay driver 106, the motor relay 105 de-energizes the current-passing path between the inverter 104 and the motor 5.

In the case where all of the monitoring control portion A 108a, the monitoring control portion B 108b, and the micro-controller 102 output the motor relay close command signal (energization), the motor relay driver 106 outputs the motor relay close command signal (energization) to the motor relay 105, and outputs the motor relay open command signal (de-energization) otherwise.

The current detection circuit 107 detects a current flowing to the motor 5 and sends the detected current value (Mi) to the micro-controller 102.

The first monitoring control portion A 108a monitors a power-supply voltage to be supplied to the micro-controller 102 and determines whether the power-supply voltage is a voltage within the normal operation range within which an operation of the micro-controller 102 is guaranteed. In the case where it is determined that the voltage is on the outside of the pre-set normal operation range, the power-supply voltage is determined as being abnormal, in which case the motor relay open command signal (de-energization) is outputted to the motor relay driver 106. Meanwhile, in the case where the power-supply voltage is determined as being normal, the motor relay close command signal (energization) is outputted to the motor relay driver 106.

Likewise, the second monitoring control portion B 108b also monitors the power-supply voltage to be supplied to the micro-controller 102 and determines whether the power-supply voltage is a voltage within the normal operation range within which an operation of the micro-controller 102 is guaranteed. In the case where it is determined that the voltage is on the outside of the pre-set normal operation range, the power-supply voltage is determined as being abnormal, in which case the motor relay open command signal (de-energization) is outputted to the motor relay driver 106. Meanwhile, in the case where the power-supply voltage is determined as being normal, the motor relay close command signal (energization) is outputted to the motor relay driver 106.

As has been described above, independent two monitoring control portions (the first monitoring control portion A 108a and the second monitoring control portion B 108b) are provided for the micro-controller 102. Accordingly, even in the case where either one of the monitoring control portions fails, a power-supply voltage to be supplied to the micro-controller 102 is monitored by the other monitoring control portion. Hence, the driving of the motor can be stopped in a reliable manner in the event of an abnormality in the power-supply voltage. It thus becomes possible to prevent in a reliable manner that the steering is assisted abnormally due to an abnormal operation of the micro-controller 102 resulting from an abnormality in the power-supply voltage. In other words, higher reliability and safety can be ensured than by a method adopting the monitoring control in the related art.

It should be noted that by providing two monitoring control portions, it becomes possible to lower a probability of a failure occurring due to a loss of the power-supply voltage monitoring function furnished to the vehicle steering control apparatus in comparison with a case where one monitoring control portion is provided. Hence, higher reliability can be ensured than by the power-supply voltage monitoring apparatus in the related art.

Also, the monitoring control portions are provided on the outside of the micro-controller 102. This configuration makes it possible to stop the driving of the motor 5 as an outside load by bypassing the micro-controller 102. Accordingly, the driving of the motor 5 can be stopped in a reliable manner even in a circumstance where a voltage supplied to the micro-controller 102 goes out of the normal operation range and the micro-controller 102 no longer operates normally.

As has been described, the electronic control unit furnished with a power-supply voltage monitoring function of the first embodiment includes multiple monitoring control portions that monitor a power-supply voltage of the micro-controller. By stopping an outside load driver controlling an outside load by bypassing the micro-controller, the outside load can be stopped quickly in a reliable manner by the outside load controlling function when the power-supply voltage goes out of the normal operation range. It can be therefore expected a significant advantage that high reliability and safety can be ensured.

Second Embodiment

Figure 3:
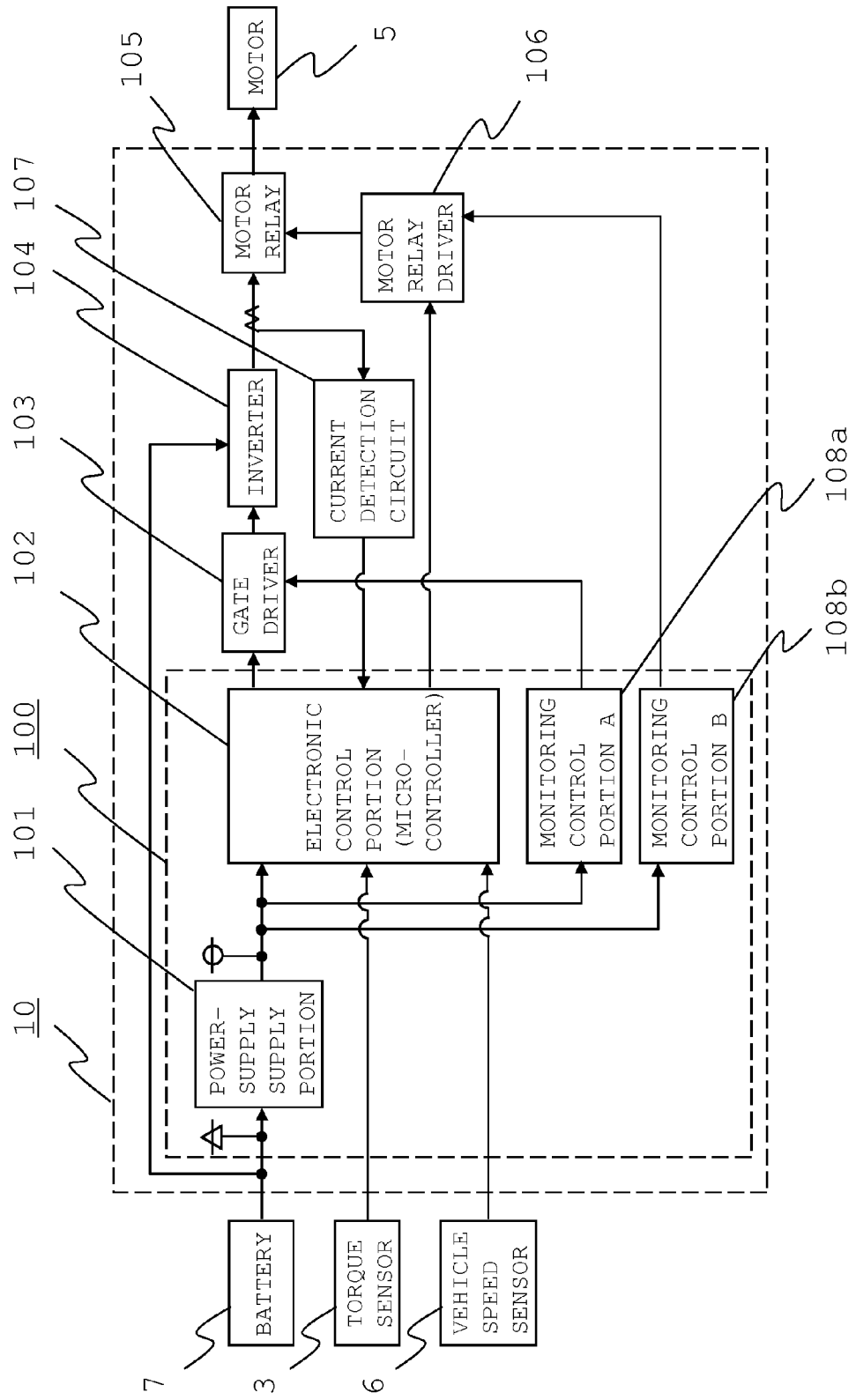
FIG. 3 is a functional block diagram showing a configuration of a vehicle steering control apparatus including an electronic control unit furnished with a power-supply voltage monitoring function of a second embodiment.

FIG. 3 is a functional block diagram showing a configuration of a vehicle steering control apparatus including an electronic control unit furnished with a power-supply voltage monitoring function of a second embodiment.

A difference between the electronic control unit furnished with a power-supply voltage monitoring function of the second embodiment shown in FIG. 3 and the electronic control unit furnished with a power-supply voltage monitoring function of the first embodiment above shown in FIG. 2 is that the output of the first monitoring control portion A 108a is connected to the gate driver 103 that controls the inverter 104. Hence, a description will be given to the gate driver 103, the motor relay driver 106, and the monitoring control portion A 108a herein and a description is omitted for the rest of the components and operations thereof which are the same as those in the first embodiment above.

A detailed operation of an electronic control unit 100 furnished with a power-supply voltage monitoring function of the second embodiment will now be described.

Initially, in the case where a drive enabling signal from the first monitoring control portion A 108a is inputted into the gate driver 103, a signal to drive the inverter 104 is outputted according to a motor drive signal outputted from the micro-controller 102. In the case where a drive stopping signal is inputted from the first monitoring control portion A 108a, a signal to stop the inverter 104 is outputted to the inverter 104. Hence, a voltage to drive the motor 5 outputted from the inverter 104 is outputted or stopped according to the signals inputted from the gate driver 103.

In the case where a motor relay close command signal (energization) is inputted into the motor relay driver 106 from both of the second monitoring control portion B 108b and the micro-controller 102, the motor relay driver 106 outputs a motor relay close command signal (energization) to the motor relay 105 and outputs a motor relay open command signal (de-energization) otherwise.

The first monitoring control portion A 108a monitors a power-supply voltage to be supplied to the micro-controller 102 and determines whether the power-supply voltage is a voltage within the normal operation range within which an operation of the micro-controller 102 is guaranteed. In the case where it is determined that the voltage is on the outside of the pre-set normal operation range, the power-supply voltage is determined as being abnormal, in which case a drive stopping signal for the inverter 104 is outputted to the gate driver 103. Meanwhile, in the case where the power-supply voltage is determined as being normal, an inverter drive signal is outputted to the gate driver 103.

As has been described, it is configured in such a manner that when an abnormality in the power-supply voltage is detected, the first monitoring control portion A 108a controls the gate driver 103 to stop the inverter 104 by outputting a drive stopping signal and also the second monitoring control portion B 108b controls the motor relay driver 106 to de-energize the current-passing path between the inverter 104 and the motor 5 by outputting a motor relay open command signal (de-energization) (in other words, each of the monitoring control portions stops the driving of the motor 5 by acting on a different portion). Even in the case where drive stopping means from one monitoring control portion fails (for example, in the event of a failure that the motor relay 105 is fused and the current-passing path cannot be de-energized), the driving of the motor 5 can be stopped by drive stopping means (means for stopping the inverter 104 using the gate driver 103) from the other monitoring control portion. It thus becomes possible to ensure further higher reliability and safety than by the method using the monitoring control portions in the first embodiment above.

As has been described, an electronic control unit furnished with a power-supply voltage monitoring function of the second embodiment includes multiple monitoring control portions monitoring a power-supply voltage of the micro-controller and each of the monitoring control portions acts on a different outside load driver, so that in the case where the power-supply voltage goes out of the normal operation range, even when an inconvenience occurs in outside load stopping means by one monitoring control portion, the outside load can be stopped quickly in a reliable manner by outside load stopping means by the other monitoring control portion. It can be therefore expected a significant advantage that high reliability and safety can be ensured.

Third Embodiment

Figure 4A:
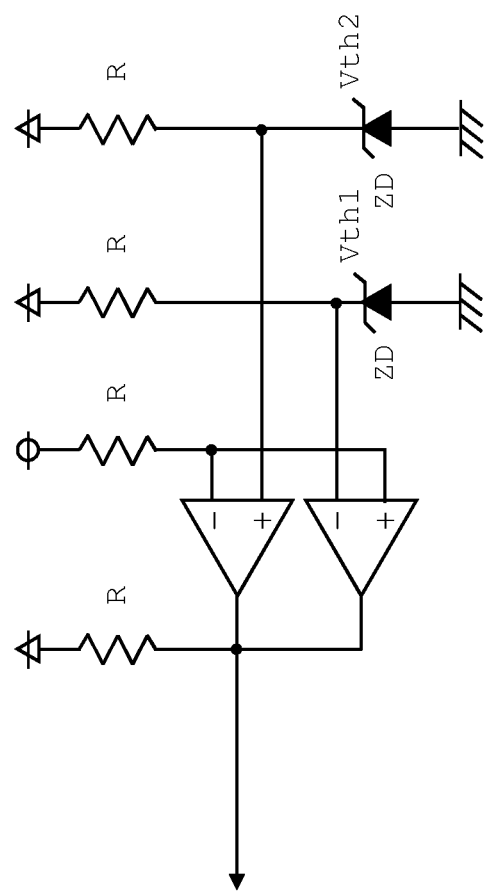
FIG. 4A and FIG. 4B are respectively a view showing circuit configurations of voltage monitoring functions furnished to monitoring control portions of an electronic control unit furnished with a power-supply voltage monitoring function of a third embodiment.
Figure 4B:
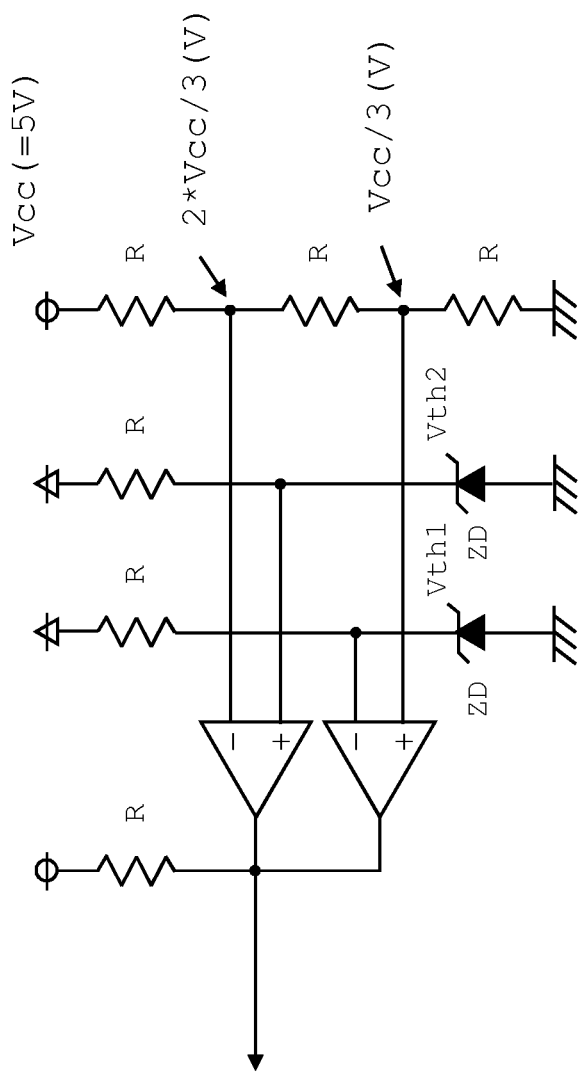

FIG. 4A and FIG. 4B are respectively a view showing circuit configurations of voltage monitoring functions furnished to monitoring control portions of an electronic control unit furnished with a power-supply voltage monitoring function of a third embodiment.

The third embodiment is configured in such a manner that the voltage monitoring functions furnished to the first monitoring control portion A 108a and the second monitoring control portion B 108b in the first embodiment and the second embodiment above are formed of different circuit networks. Herein, a description will be given to specific operations of the voltage monitoring functions furnished to the first monitoring control portion A 108a and the second monitoring control portion B 108b and a description is omitted for the rest of the components and operations thereof which are the same as those in the first embodiment or the second embodiment above.

Functions furnished to the first monitoring control portion A 108a and the second monitoring control portion B 108b are the same. However, specific voltage monitoring functions are different from each other as are shown in FIG. 4A and FIG. 4B.

For example, as is shown in FIG. 4A, according to the voltage monitoring function furnished to the first monitoring control portion A 108a, a voltage is monitored by making comparative voltages, a lower threshold voltage X [V] and an upper threshold voltage Y [V] in the normal operation range of a power-supply voltage, on the basis of a battery voltage (indicated by Δ) and comparing these comparative voltages with a power-supply voltage of 5 V (indicated by O) to be supplied to the micro-controller 102. In short, an absolute value monitoring method is adopted herein.

In contrast, for example, as is shown in FIG. 4B, according to the voltage monitoring function furnished to the second monitoring control portion B 108b, a voltage is monitored by dividing a power-supply voltage of 5 V (=Vcc) to be supplied to the micro-controller 102 into 2*Vcc/3 [V] and Vcc/3 [V] and comparing these divided voltages with a lower threshold voltage x [V] and an upper threshold voltage y [V] in the normal operation range of the power-supply voltage made on the basis of the battery voltage (indicated by Δ). In short, a divided-voltage monitoring method is adopted herein.

As has been described above, the voltage monitoring functions furnished to the monitoring control portion A 108*a* and the monitoring control portion B 108*b* are formed of different circuit networks (in other words, designed for different circuit operations). Hence, for example, in the case where the power-supply voltage goes out of the normal operation range of the micro-controller 102 by some inconvenience occurring on the circuit, even when the voltage monitoring function furnished to one monitoring control portion fails to function as intended, it is possible to continue to monitor the power-supply voltage by the voltage monitoring function furnished to the other monitoring control portion. More specifically, by forming the voltage monitoring functions of different circuit designs, it becomes possible to avoid the occurrence of inconveniences in the voltage monitoring functions furnished to the monitoring control portion A 108*a* and the monitoring control portion B 108*b* at the same time due to a systematic failure.

As has been described, the electronic control unit furnished with a power-supply voltage monitoring function of the third embodiment includes multiple monitoring control portions monitoring a power-supply voltage of the micro-controller and the voltage monitoring functions furnished to the respective control monitoring portions are formed of different circuit networks, so that in the case where the power-supply voltage goes out of the normal operation range of the micro-controller, even when the voltage monitoring function furnished to one monitoring control portion fails to function as intended due to some inconvenience on the circuit, it becomes possible to continue to monitor the power-supply voltage by the voltage monitoring function furnished to the other monitoring control portion. It can be therefore expected a significant advantage that high reliability and safety can be ensured for the voltage monitoring functions furnished to the monitoring control portions.

Fourth Embodiment

Figure 5:
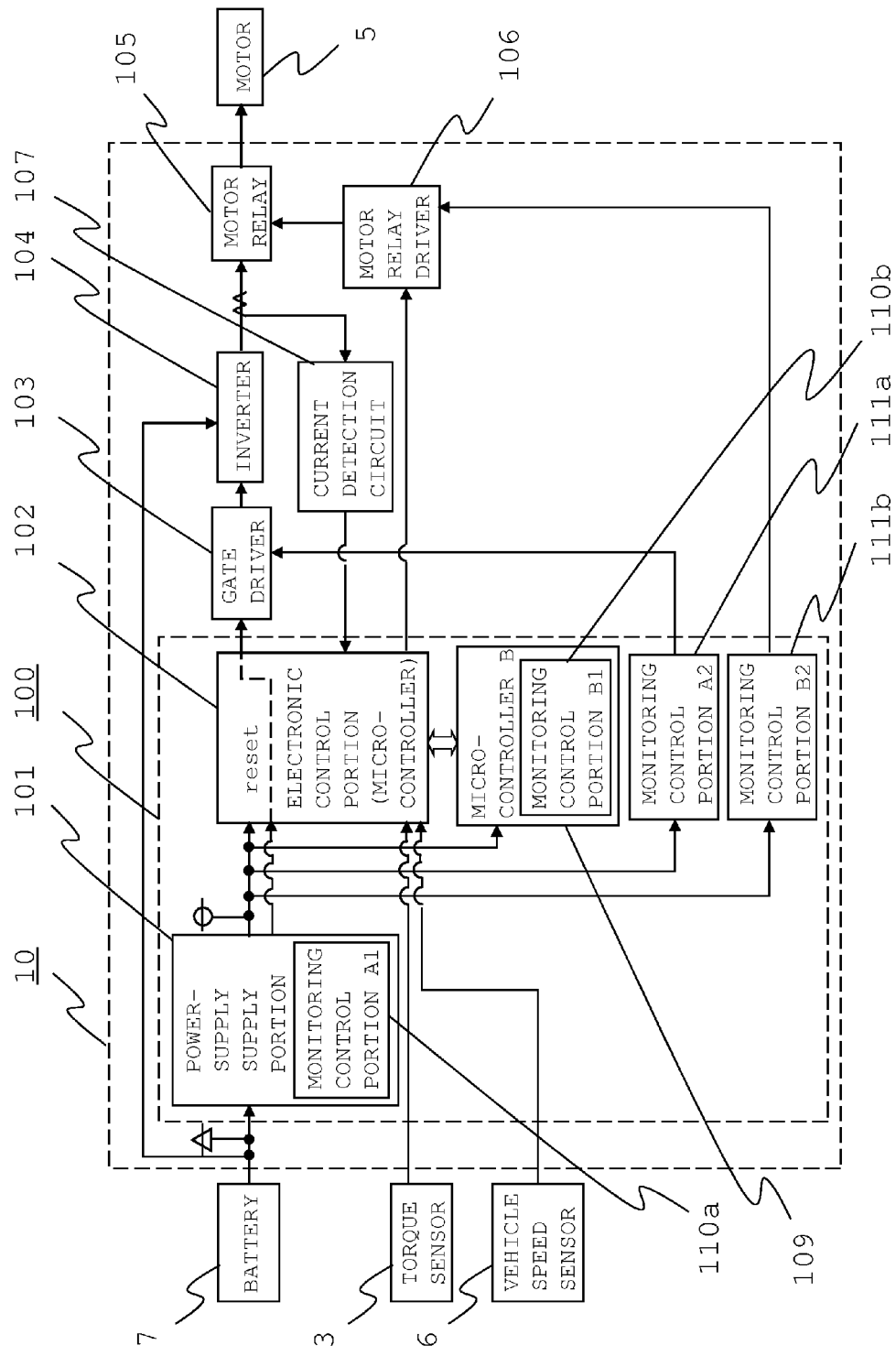
FIG. 5 is a functional block diagram showing a configuration of a vehicle steering control apparatus including an electronic control unit furnished with a power-supply voltage monitoring function of a fourth embodiment.

FIG. 5 is a functional block diagram showing a configuration of a vehicle steering control apparatus including an electronic control unit furnished with a power-supply voltage monitoring function of a fourth embodiment.

Differences between the electronic control unit furnished with a power-supply voltage monitoring function of the fourth embodiment shown in FIG. 5 and the electronic control unit furnished with a power-supply voltage monitoring function of the second embodiment above shown in FIG. 3 are that a micro-controller B 109, which is a secondary electronic control portion, is additionally provided and that the function furnished to the first monitoring control portion A 108*a* of FIG. 3 is taken over by a monitoring control portion A1 110*a* and a monitoring control portion A2 111*a* and the function furnished to the second monitoring control portion B 108*b* is taken over by a monitoring control portion B1 110*b* and a monitoring control portion B2 111*b*. Hence, a description will be given to the micro-controller B 109, the monitoring control portion A1 110*a*, the monitoring control portion A2 111*a*, the monitoring control portion B1 110*b*, and the monitoring control portion B2 111*b* herein and a description is omitted for the rest of the components and operations thereof which are the same as those in the second embodiment above.

A detailed operation of an electronic control unit 100 furnished with a power-supply voltage monitoring function of the fourth embodiment will now be described.

The micro-controller B 109 monitors an operation of the micro-controller 102, which is the main electronic control portion. Generally, a vehicle steering control apparatus is furnished with various fail-safe functions in order to forestall an accident triggered by a failure and there may be a case where the vehicle steering control apparatus is provided with a micro-controller to realize the fail-safe functions apart from the micro-controller that outputs a control signal to control the motor (for example, WO2007/138676). The fourth embodiment will describe a case where an electronic control unit furnished with a power-supply voltage monitoring function provided with the micro-controller B 109 is applied to a vehicle steering control apparatus.

The monitoring control portion A1 110*a* is built in the power-supply supply portion 101 and monitors a voltage lower than the normal operation range of a power-supply voltage to be supplied to the micro-controller 102 using its voltage monitoring function. In the case where the power-supply voltage is a voltage lower than a pre-set lower threshold voltage, the monitoring control portion A1 110*a* determines that the power-supply voltage is abnormal and outputs a reset signal to the micro-controller 102. In the case where the monitoring control portion A1 110*a* determines that the power-supply voltage is abnormal, the monitoring control portion A1 110*a* acts on the gate driver 103 to stop the driving of the inverter 104 by resetting the micro-controller 102 so that an output of the micro-controller 102 is changed to high impedance.

In contrast, the monitoring control portion A2 111*a* monitors a voltage higher than the normal operation range of the power-supply voltage to be supplied to the micro-controller 102 using its voltage monitoring function. In the case where the power-supply voltage is a voltage higher than a pre-set upper threshold voltage, the monitoring control portion A2 111*a* determines that the power-supply voltage is abnormal and outputs a drive stopping signal to the gate driver 103. Meanwhile, in the case where the monitoring control portion A2 111*a* determines that the power-supply voltage is normal, the monitoring control portion A2 111*a* outputs a drive enabling signal to the gate driver 103.

The monitoring control portion B1 110*b* is built in the micro-controller B 109 and monitors a voltage lower than the normal operation range of a power-supply voltage to be supplied to the micro-controller 102 using its voltage monitoring function. In the case where the power-supply voltage is a voltage lower than a pre-set lower threshold voltage, the monitoring control portion B1 110*b* determines that the power-supply voltage is abnormal and outputs a motor relay open command signal (de-energization) to the motor relay driver 106.

The monitoring control portion B2 111*b* monitors a voltage higher than the normal operation range of a power-supply voltage to be supplied to the micro-controller 102 using its voltage monitoring function. In the case where the power-supply voltage is a voltage higher than a pre-set upper threshold voltage, the monitoring control portion B2 111*b* determines that the power-supply voltage is abnormal and outputs a motor relay open command signal (de-energization) to the motor relay driver 106.

As has been described, independent two monitoring control portions (the monitoring control portion A1 110*a* and the monitoring control portion B1 110*b*) furnished with a voltage monitoring function for the lower threshold voltage of the power-supply voltage and independent two monitoring control portions (the monitoring control portion A2 111*a* and the monitoring control portion B2 111*b*) furnished with a voltage monitoring function for the upper threshold voltage are provided for the micro-controller 102. Hence, even in the case where an inconvenience occurs in the voltage monitoring function furnished to any one of the monitoring control portions, a power-supply voltage to be supplied to the micro-controller 102 is monitored by the voltage monitoring functions furnished to the rest of the monitoring control portions. It thus becomes possible to stop the driving of the motor in a reliable manner in the event of an abnormality in the power-supply voltage.

As has been described, the electronic control unit furnished with a power-supply voltage monitoring function of the fourth embodiment includes multiple monitoring control portions monitoring a power-supply voltage of the micro-controller, independent two monitoring control portions furnished with a voltage monitoring function of monitoring whether the power-supply voltage is lower than a lower threshold voltage of the power-supply voltage, and independent two monitoring control portions furnished with a voltage monitoring function of monitoring whether the power-supply voltage is higher than an upper threshold voltage. Hence, in the case where the power-supply voltage goes out of the normal operation range, even when an inconvenience occurs in either the voltage monitoring function for the upper threshold voltage or the voltage monitoring function for the lower threshold voltage, because each includes more than one voltage monitoring function, it becomes possible to stop an outside load quickly in a reliable manner in response to an abnormality in the power-supply voltage. It can be therefore expected a significant advantage that high reliability and safety can be ensured.

In comparison with a case where two monitoring control portions each of which is configured to monitor whether the power-supply voltage is higher than the upper threshold voltage and lower than the lower threshold voltage in the normal operation range of the power-supply voltage, each monitoring control portion can be of a simpler configuration. It thus becomes possible to lower the probability of a failure that the monitoring function is lost. In short, further higher reliability can be ensured.

Also, it is configured in such a manner that upon detection of an abnormality in the power-supply voltage, the voltage monitoring function furnished to the monitoring control portion A1 110*a* monitoring whether the power-supply voltage is lower than the lower threshold voltage and the voltage monitoring function furnished to the monitoring control portion A2 111*a* monitoring whether the power-supply voltage is higher than the upper threshold voltage act on the gate driver 103 so as to stop the driving of the inverter 104, whereas the monitoring control portion B1 110*b* monitoring whether the power-supply voltage is lower than the lower threshold voltage and the monitoring control portion B2 111*b* monitoring whether the power-supply voltage is higher than the upper threshold voltage act on the motor relay driver 106 so that the motor relay 105 de-energizes the current-passing path between the inverter 104 and the motor 5. Hence, even in the case where a failure occurs in one drive stopping means of the motor 5 (for example, even in the event of a failure that the motor relay 105 is fused and the current-passing path cannot be de-energized), the driving of the motor 5 can be stopped by the other motor driving stopping means (means for stopping the driving of the inverter 104).

In addition, by building the monitoring control portion A1 110*a* monitoring whether the power-supply voltage is lower than the lower threshold voltage in the power-supply supply portion 101, the cost can be reduced in comparison with a case where the monitoring control portion A1 110*a* is provided on the outside of the power-supply supply portion 101.

Further, by building the monitoring control portion B1 110*b* monitoring whether the power-supply voltage is lower than the lower threshold voltage in the micro-controller B 109, the cost can be reduced in comparison with a case where the monitoring control portion B1 110*b* is provided on the outside of the micro-controller B 109.

Also, the voltage monitoring function furnished to the monitoring control portion A1 110*a* monitoring whether the power-supply voltage is lower than the lower threshold voltage stops the driving of the motor 5 by inputting a reset signal to the reset terminal of the micro-controller 102 upon detection of an abnormality in the power-supply voltage. Herein, the cost can be reduced in comparison with a case where the driving of the motor 5 is stopped by bypassing the micro-controller 102.

Because the monitoring control portion A1 110*a* and the monitoring control portion B1 110*b* monitoring whether the power-supply voltage is lower than the lower threshold voltage use the voltage monitoring functions for the lower threshold voltage built in the power-supply supply portion 101 and the micro-controller B 109, respectively, the monitoring control portion A1 110*a* and the monitoring control portion B1 110*b* are formed of different circuit networks (that is, different circuit designs). Hence, for example, even in the case where one monitoring control portion fails to function as intended due to a design inconvenience, the monitoring of the power-supply voltage can be continued by the other monitoring control portion. In other words, by adopting different circuit designs, it becomes possible to avoid the occurrence of inconveniences in the monitoring control portions A1 110*a* and the monitoring control portion B1 110*b* at the same time due to a systematic failure.

Further, the monitoring control portion A2 111*a* and the monitoring control portion B2 111*b* monitoring whether the power-supply voltage is higher than the upper threshold voltage stop the driving of the motor 5 as an outside load by bypassing the micro-controller 102. Hence, even in a circumstance where the power-supply voltage to be supplied to the micro-controller 102 rises above the upper threshold voltage and an inconvenience occurs in the micro-controller 102 due to a high voltage on the outside of the normal operation range of the power-supply voltage, the driving of the motor 5 can be stopped in a reliable manner.

Fifth Embodiment

Figure 6:
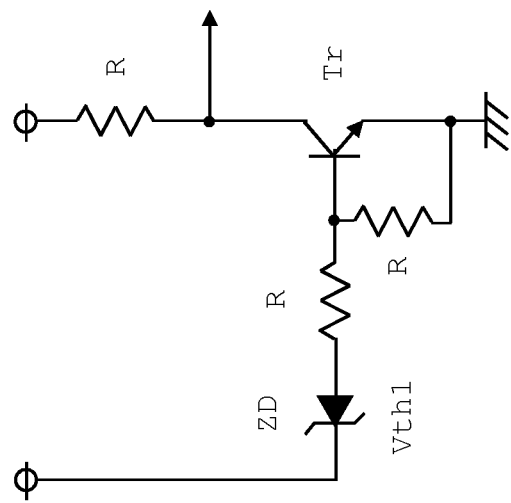
FIG. 6 is a view showing a circuit configuration of a voltage monitoring function furnished to monitoring control portions of an electronic control unit furnished with a power-supply voltage monitoring function of a fifth embodiment.

FIG. 6 is a view showing a circuit configuration of voltage monitoring functions furnished to monitoring control portions of an electronic control unit furnished with a power-supply voltage monitoring function of a fifth embodiment.

The fifth embodiment is configured in such a manner that the voltage monitoring functions furnished to the monitoring control portion A2 111*a* and the monitoring control portion B2 111*b* in the fourth embodiment above are formed of identical circuit networks using different circuit parts. Herein, a description will be given to specific operations of the voltage monitoring functions furnished to the monitoring control portion A2 111*a* and the monitoring control portion B2 111*b* and a description is omitted for the rest of the components and operations thereof which are the same as those in the fourth embodiment above.

The monitoring control portion A2 111*a* and the monitoring control portion B2 111*b* are furnished with the identical functions but have internal configurations different from each other. For example, the respective circuit networks are of a simple circuit design as is shown in FIG. 6 and each circuit is formed using different parts (for example, parts available from different manufacturers). For example, the voltage monitoring function for the upper threshold voltage Y [V] of FIG. 6 is realized by a circuit design different from the circuit networks of the third embodiment shown in FIG. 4A and FIG. 4B.

As has been described, the monitoring control portion A2 111*a* and the monitoring control portion B2 111*b* monitoring a high voltage are formed of identical circuit networks but parts used for each circuit are different (for example, parts available from different manufacturers are used). It thus becomes possible to avoid a situation in which the voltage monitoring functions furnished to the monitoring control portion A2 111*a* and the monitoring control portion B2 111*b* are lost at the same time due to a design-originated inconvenience or a lot-originated deficiency of the parts themselves.

As has been described, the electronic control unit furnished with a power-supply voltage monitoring function of the fifth embodiment includes multiple monitoring control portions monitoring a power-supply voltage of the micro-controller and circuits in the respective circuit networks forming the voltage monitoring functions furnished to the multiple monitoring control portions are formed using different parts. Hence, it becomes possible to avoid a situation that the voltage monitoring functions are lost at the same time due to design-originated inconveniences or lot-originated deficiencies of the parts themselves, so that the outside load can be stopped quickly in a reliable manner in response to an abnormality in the power-supply voltage. It can be therefore expected a significant advantage that high reliability and safety can be ensured.

In the second embodiment above, it is configured in such a manner that in the case where the voltage monitoring function furnished to the monitoring control portion A 108*a* detects an abnormality in the power-supply voltage, the driving of the inverter 104 is stopped via the gate deriver 103. It is, however, also possible to adopt a method by which a power-supply relay is disposed in a power supply path from the battery 7 to the inverter 104 and the driving of the inverter 104 is stopped by opening this power-supply relay by the power-supply relay driver from one monitoring control portion.

In the fourth embodiment above, it is configured in such a manner that a power-supply voltage to be supplied to the micro-controller 102 is monitored by the monitoring control portion B1 110*b* built in the micro-controller B 109, and in the case where the power-supply voltage is a voltage lower than the pre-set lower threshold voltage, it is determined that the power-supply voltage is abnormal, so that a motor relay open command signal (de-energization) is outputted to the motor relay driver 106. Alternatively, it may be configured in such a manner that in the case where the power-supply voltage is determined as being abnormal, the driving of the motor 5 is stopped by resetting the micro-controller B 109 to change an output of the micro-controller B 109 to high impedance so that the micro-controller B 109 acts on the motor relay driver 106.

Also, in the fourth embodiment above, the monitoring control portion A2 111*a* and the monitoring control portion B2 111*b* monitoring whether a power-supply voltage to be supplied to the micro-controller 102 is higher than the upper threshold voltage are independent circuits. Alternatively, it may be configured in such a manner that, for example, the gate driver 103 is formed of an IC and the monitoring control portion A2 111*a* is built in this IC.

Also, in the fifth embodiment above, the monitoring control portion A2 111*a* and the monitoring control portion B2 111*b* monitoring whether a power-supply voltage to be supplied to the micro-controller 102 is higher than the upper threshold voltage are formed of identical circuit networks. It should be appreciated, however, that these control portions may be formed of different circuit networks.

The embodiments above have described cases where the electronic control unit furnished with a power-supply voltage monitoring function of the invention is applied to a vehicle steering control apparatus controlling a vehicle motor as an outside load. It should be appreciated, however, that the electronic control unit may be applied to an electronic device used for other purposes of controlling an outside load by the micro-controller, in which case advantages same as those of the embodiments above can be also obtained.

In particular, the functional safety standards ISO26262 subject to automobiles require considerations of multiple failures. Besides the vehicle steering control apparatus, by applying the electronic control unit furnished with a power-supply voltage monitoring function of the invention to a system performing control relating to the steering, braking, and running that influence a vehicle behavior using the micro-controller, it becomes possible to form an electronic control unit furnished with a power-supply voltage monitoring function and capable of maintaining high reliability and safety even when multiple failures are taken into consideration.

The outside load driver controlling the outside load may be formed integrally with the outside load, in which case the outside load controlling function outputs a command signal to the outside load.

It should be appreciated that the embodiments of the invention can be combined without any restriction and the respective embodiments can be modified and omitted as the need arises within the scope of the invention.

In the respective drawings, same reference numerals denote same or equivalent portions.

REFERENCE SIGNS LIST

5: motor
7: battery
10: steering control apparatus
100: electronic control unit furnished with power-supply voltage monitoring function
101: power-supply supply portion
102: micro-controller (electronic control portion, main electronic control portion)
103: gate driver
104: inverter
105: motor relay
106: motor relay driver
108*a*: monitoring control portion A
108*b*: monitoring control portion B
109: micro-controller B (secondary electronic control portion)
110*a*: monitoring control portion A1

110b: monitoring control portion B1
111a: monitoring control portion A2
111b: monitoring control portion B2

The invention claimed is:

1. A vehicle power steering control apparatus including an electronic control unit configured to monitor a power-supply voltage, the electronic control unit comprising:
   an electronic control portion configured to output a control signal that controls an outside load to an outside load controller, the outside load controller including at least two outside load drivers to control the outside load;
   a power-supply supply portion configured to adjust a voltage of an outside power supply to be supplied to a supply terminal of the electronic control portion to be a voltage within a normal operation range of the electronic control portion and to supply the adjusted voltage; and
   at least two independent monitoring control portions, each of which is configured to monitor the adjusted voltage outputted from the power-supply supply portion, and each of which is connected to a respective one of the outside load drivers,
   wherein in the case where the monitoring control portions detect that the adjusted voltage is outside of the normal operation range, each of the monitoring control portions is further configured to output control signals, which bypass the electronic control portion, to the connected one of the outside load drivers so as to stop driving of the outside load by stopping the control of the outside load by the outside load drivers,
   wherein the electronic control portion includes an inverter configured to supply power to drive the outside load,
   wherein the outside load is a motor that generates a steering assist torque, and
   wherein the outside load drivers include a power-supply relay driver configured to control a power-supply relay that opens and closes a power supplying path to the inverter, a gate driver controlling the inverter, and a motor relay driver controlling a motor relay that opens and closes a current-passing path between the inverter and the motor.

2. The vehicle power steering control apparatus according to claim 1, wherein
   at least one of the monitoring control portions is further configured to, via the electronic control portion, stop the driving of the outside load by inputting a reset signal to a reset terminal of the electronic control portion.

3. The vehicle power steering control apparatus according to claim 1, wherein
   each of the monitoring control portions is connected to a different one of the outside load drivers.

4. The vehicle power steering control apparatus according to claim 1, wherein
   the monitoring control portions are of circuit configurations different from each other.

5. The vehicle power steering control apparatus according to claim 1, wherein
   the monitoring control portions are formed of circuit parts different from each other.

6. The vehicle power steering control apparatus according to claim 1, wherein
   one of the monitoring control portions is provided in the power-supply supply portion.

7. The vehicle power steering control apparatus according to claim 1, wherein
   one of multiple monitoring control portions is provided in the outside load controller.

8. The vehicle power steering control apparatus according to claim 1,
   wherein the electronic control portion includes a main electronic control portion and a secondary electronic control portion, and
   wherein one of the monitoring control portions is provided to the secondary electronic control portion.

9. The vehicle power steering control apparatus according to claim 1, wherein the multiple monitoring portions are configured to operate independently from each other.

* * * * *